United States Patent
Hsu et al.

(10) Patent No.: US 8,024,679 B2
(45) Date of Patent: *Sep. 20, 2011

(54) STRUCTURE FOR APPARATUS FOR REDUCED LOADING OF SIGNAL TRANSMISSION ELEMENTS

(75) Inventors: Louis L. Hsu, Fishkill, NY (US); Karl D. Selander, Hopewell Junction, NY (US); Michael A. Sorna, Hopewell Junction, NY (US); Daniel W. Storaska, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 697 days.

This patent is subject to a terminal disclaimer.

(21) Appl. No.: 11/999,627

(22) Filed: Dec. 6, 2007

(65) Prior Publication Data

US 2009/0146692 A1      Jun. 11, 2009

(51) Int. Cl.
  *G06F 17/50* (2006.01)
(52) U.S. Cl. ........................................ 716/101
(58) Field of Classification Search ............... 716/1, 101
  See application file for complete search history.

(56) References Cited

U.S. PATENT DOCUMENTS

| | | | |
|---|---|---|---|
| 4,157,509 A * | 6/1979 | Zielinski | 327/68 |
| 4,651,084 A * | 3/1987 | Welsh et al. | 324/523 |
| 4,805,063 A * | 2/1989 | Kataoka et al. | 361/16 |
| 4,924,430 A | 5/1990 | Zasio et al. | |
| 5,402,358 A | 3/1995 | Smith et al. | |
| 5,619,418 A | 4/1997 | Blaauw et al. | |
| 5,706,224 A | 1/1998 | Srinivasan et al. | |
| 5,815,406 A | 9/1998 | Golla et al. | |
| 6,038,381 A * | 3/2000 | Munch et al. | 716/1 |
| 6,209,122 B1 | 3/2001 | Jyu et al. | |
| 6,314,546 B1 | 11/2001 | Muddu | |
| 6,380,791 B1 | 4/2002 | Gupta et al. | |
| 6,389,581 B1 | 5/2002 | Muddu et al. | |
| 6,519,749 B1 | 2/2003 | Chao et al. | |
| 6,711,719 B2 * | 3/2004 | Cohn et al. | 716/2 |
| 6,836,877 B1 * | 12/2004 | Dupenloup | 716/18 |
| 2002/0040466 A1 | 4/2002 | Khazei | |
| 2003/0132741 A1 * | 7/2003 | Senthilkumar et al. | 324/100 |
| 2004/0153982 A1 | 8/2004 | Zhang et al. | |
| 2004/0189339 A1 * | 9/2004 | Conner | 324/765 |

* cited by examiner

*Primary Examiner* — Jack Chiang
*Assistant Examiner* — Brandon W Bowers
(74) *Attorney, Agent, or Firm* — Joseph P. Abate; Daryl Neff

(57) ABSTRACT

A design structure for a signal-handing apparatus or communication apparatus is provided which includes a common signal node operable to conduct a first signal, a first circuit coupled to the common signal node to utilize the first signal and a signal-handling element coupled to the common signal node. A signal-handling apparatus may include an isolating circuit coupled to a first conductor, a second conductor to conduct an output of the isolating circuit, and a signal-handling circuit coupled to the second conductor. A signal-handling circuit can perform a signal-handling function in response to the output of the isolating circuit. The signal-handling circuit and the first circuit may be isolated from the second conductor and the signal-handling circuit such that a communication signal may be conducted with less capacitance and be subject to less return loss.

4 Claims, 12 Drawing Sheets

US 8,024,679 B2

STRUCTURE FOR APPARATUS FOR REDUCED LOADING OF SIGNAL TRANSMISSION ELEMENTS

BACKGROUND OF THE INVENTION

The present invention relates to design structures, such as design structures embodied in a machine-readable medium used in a design process, the design structure including circuits, devices and methods for transmitting signals along conductors, especially transmission lines.

Transmission lines are frequently provided by pairs of conductors used to carry signals between one integrated circuit ("IC") or "chip" and another chip, e.g., as provided on a circuit board or wiring substrate. A transmission line has a signal conductor, e.g., a wire, or conductive trace, which is typically maintained at a constant or nearly constant spacing with respect to a ground conductor or other reference conductor. For example, a transmission line can include a first signal-carrying wire held at a constant spacing relative to a ground plane in the case of a microstrip line. In another example, a conductive sheathing forms the reference conductor, such as in the case of a coaxial cable.

In a particular example, transmission lines are provided as a combination of wiring and ground conductors used to transmit signals from one location to another within a single chip. Signals transmitted on transmission lines appear as waves in which voltage and current vary with respect to time and also vary with respect to position along the transmission line. Microelectronic circuits used in today's advanced systems, especially those designed to transmit or receive signals from transmission lines, are particularly sensitive to signal return loss. Signal return loss can be understood in terms of the propagation of voltage and/or current waves along transmission lines.

Characteristic impedance of a transmission line can transition sharply at a boundary between a transmission line and signal-receiving equipment. Sharp changes in the characteristic impedance can cause voltage and current wave signal energy to be reflected. Signal return loss is a measure of the reflection of signal energy at such boundary between a transmission line and an interface therefrom. Signal return loss can be expressed as a ratio of the magnitude of the reflected voltage wave to the magnitude of the voltage wave arriving from the transmission line. Communications-receiving circuits are particularly sensitive to signal return loss at interfaces between transmission channels and front-end interfaces of receiving circuits. This is particularly true of circuitry such as that used in signal transmitting and receiving circuits designed to operate at radio frequencies. In some communications systems known as "SerDes" (serializer-deserializer) circuits, serialized communication signals are transmitted on transmission lines at rates up to many gigabits per second (Gbs). One particular type of SerDes circuits are provided in "HSS" (high-speed SerDes) cores of certain integrated circuits or "chips".

Providing well-matched terminations to transmission lines at the interfaces to the transmission lines is one way that signal return loss can be reduced. However, achieving well-matched terminations can be problematic. In some types of devices, particularly devices designed to receive signals from relatively long external transmission lines, such as high-speed SerDes circuits, loading of the critical wiring paths at the input interface can be a significant contributor to signal return loss. "Loading" refers to the various sources of impedance which, in the aggregate, determine the characteristic impedance presented by the signal-receiving equipment at the input interface thereof.

In an HSS core, capacitance due to the wiring along the critical paths of the interface contributes heavily to the loading. In some cases, some loading is inevitable at an input interface to signal-receiving circuits of an HSS core. Multiple circuits need to be present at the input interface of an HSS core.

Such loading is best seen in FIG. 1. That figure provides a block and schematic diagram of circuitry 100 according to the prior art which is provided at an interface to a transmission line. Such circuitry and transmission line can be provided as an element of a chip; for example, as transmitting or receiving circuitry used to transmit or receive a signal on a chip itself, e.g., for transmission of data and/or clock or control signals. Alternatively, such circuitry and transmission line can be provided in communications handling circuitry 100 which forms a part or all of front end circuitry of a receiver. According to yet another alternative, FIG. 1 is illustrative of part or all of circuitry at an external interface of a transmitter.

For purposes of illustration, it will be assumed that the communications apparatus 100 is front end circuitry of a receiver. A communication signal is input to such apparatus at input terminal 102. A first circuit block A (120) is interposed between the input terminal and an internal node N1 (122). A second circuit block B (130) is interposed between the node N1 and an internal node N2 (132). A third circuit block C (140) is interposed between node N2 (132) and the output (142) of the communications handling circuitry (100). The first, second and third circuit blocks typically either condition or modify the communication signal inputted to the communications handling circuitry 100. Alternatively, one or more of these circuit blocks functions to protect the communications circuitry against a harmful overvoltage condition at the input terminal 102, e.g., to prevent electro-static discharge ("ESD").

The circuit blocks A, B and C lie in a sequential communication path referred to as a "critical path", because the communication signal is transferred between circuit blocks under conditions which must best preserve its quality. In addition to these circuit blocks, the communications circuitry 100 also includes a one or more signal-handling elements D1 (150), D2 (160), and D3 (170), which are arranged to perform functions in response to the communication signal, i.e., the communication signal as exists at internal node N2.

The layout of communications circuitry shown in FIG. 1 is illustrative of the relative sizes of the above-described circuit blocks and wiring that connects them together in an integrated circuit ("IC") or "chip". Due to limited space on the chip, especially along the critical path, the additional signal-handling elements have to be placed relatively far from input terminal 102 of the communications circuitry. However, such layout impacts the quality of the signal ultimately output at terminal 142 by the communications handling circuitry. Significant loading of the critical communication path results from the long wiring 134 that links the added signal-handling elements 150, 160 and 170 to node N2. Such loading, in addition to junction and gate capacitance, inherently degrades the signal integrity in the HSS core. Typically, a specification for a communication standard sets a maximum limit for signal return loss. For example, the specification for the "10 Gigabit Ethernet Attachment Unit Interface" ("XAUI") standard limits the maximum return loss to −10 dB for signal transmission frequencies above about 100 MHz. This tolerance remains at least as strict for much higher signal transmission frequencies. For example, the maximum return loss remains limited to −10 dB even at a signal transmission frequency of 2.5 GHz, i.e., at a transmission rate ranging to about 5 Gbs. To meet this standard at a transmission frequency of 2.5 GHz, the maximum parasitic capacitance that can be tolerated is about 0.85 pF, even when it is assumed that the 50 ohm transmission line is terminated in an impedance which perfectly matches its impedance.

U.S. Pat. No. 6,380,791 to Gupta et al. describes a method to reduce loading on a specific node attached to a switch used for tuning a resistive network. In such method, the switch is modified into a segmented switch, or switch resistor network is modified into tree-like segment switch to reduce loading on the specific node. However, Gupta et al. does not deal with capacitive loading at an input or output interface of communications transmission or receiving equipment.

SUMMARY OF THE INVENTION

According to one aspect of the invention, a design structure is provided for a signal-handing apparatus or communication apparatus which includes a common signal node operable to conduct a first signal, a first circuit coupled to the common signal node to utilize the first signal and a signal-handling element coupled to the common signal node. A signal-handling apparatus can include an isolating circuit coupled to a first conductor, a second conductor operable to conduct an output of the isolating circuit, and a signal-handling circuit coupled to a second conductor. A signal-handling circuit can be operable to perform a signal-handling function in response to the output of the isolating circuit. The signal-handling circuit and the first circuit may be isolated from the second conductor and the signal-handling circuit. With greater isolation, a communication signal included in the first signal may be conducted within a communication apparatus with less capacitance and produce less return loss of that signal.

According to a particular aspect of the invention, the design structure may include a communication apparatus which includes a common signal node operable to conduct a first communication signal, a first circuit coupled to the common signal node to perform first analog signal processing of the first communication signal and a signal-handling element coupled to the common signal node. The signal-handling element may include an isolating circuit coupled to the first conductor, a second conductor operable to conduct an output of the isolating circuit, and a signal-handling circuit coupled to the second conductor. The signal-handling circuit is responsive to the output of the isolating circuit to perform a signal-handling function. The signal-handling circuit and the first circuit may be isolated from the second conductor and the signal-handling circuit. In such way, the communication signal may be conducted within the communication apparatus with less capacitance and decreased return loss of that signal.

DETAILED DESCRIPTION

Figure 1:
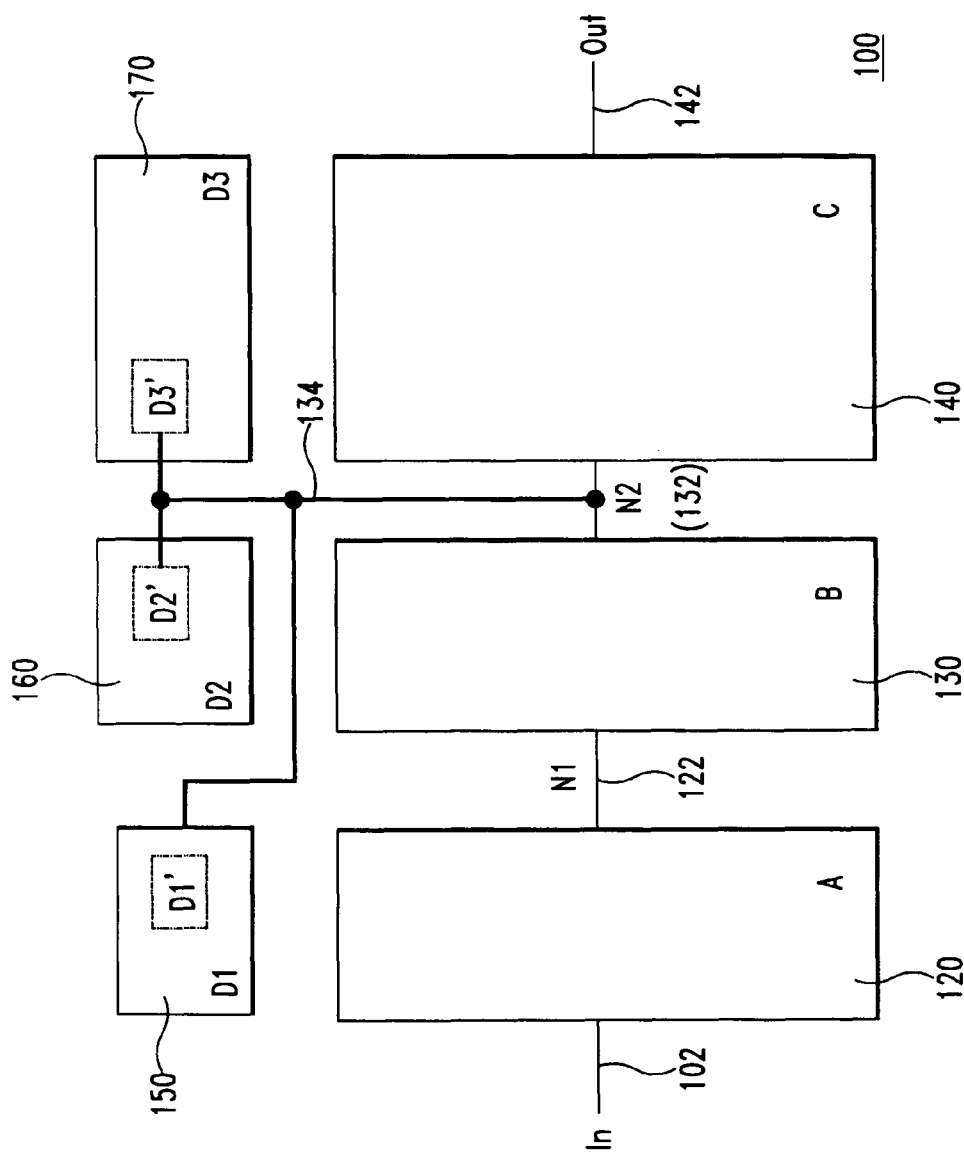
FIG. 1 is a top-down plan view of a system, e.g., a chip, in accordance with the prior art.

Commonly owned U.S. application Ser. No. 10/908,959 filed Jun. 2, 2005, entitled "Apparatus And Method For Reduced Loading Of Signal Transmission Elements", which claims subject matter similar to that of the present application and is hereby incorporated herein by reference.

According to an embodiment of the invention described herein, an apparatus is provided in which a first signal, for example, an information-bearing signal such as a data signal, a control signal, or a clock signal, is conducted on a first conductor via a common node to a first circuit. The first circuit receives, conditions or otherwise utilizes the first signal. Illustratively, the first conductor defines a critical signal path. One or more signal-handling elements are also connected to the common node, such signal-handling element also receiving, conditioning, or otherwise utilizing the first signal. In one example, the signal handling element is an element which determines a state of the first signal in response to detecting a condition present at the common signal node. The signal-handling element includes an isolating circuit coupled to the common node, which is operable to output a second signal on a second conductor. The isolating circuit is operable to isolate the first circuit and the common node from the second conductor and the signal-handling circuit. In consequence, the second conductor is at least load-isolated from the common signal node such that the second conductor and any element downstream from the second conductor does not load the first conductor. The signal-handling element also includes a signal-handling circuit which is operable to perform a signal-handling function. Illustratively, the signal-handling function can be the determination of whether a valid first signal is present based on detecting a characteristic from the second signal.

In particular embodiments of the invention, a communication apparatus is provided in which a first communication signal, for example, an information-bearing signal, is conducted on a first conductor at a common signal node to a first circuit operable to perform analog signal processing, for example, analog amplification of the first communication signal. Illustratively, the first conductor defines a critical communication path. A signal-handling element of the communication apparatus also includes a signal-handling element. The signal handling element may be, for example, an element which is responsive to the first communication signal to determine a state of communication at the common signal node. Illustratively, the signal-handling element is a signal detector element; i.e., an element functioning to determine whether or not an active communication signal is present at the common signal node. In another example, the signal-handling element is an element which functions to detect a fault apparently caused by a problem of a cable designated for transmitting the first communication signal.

In communication apparatuses according to the embodiments of the invention, the signal-handling element includes an isolating circuit coupled to the common signal node, the isolating circuit being operable to output a second signal on a second conductor isolated from the common signal node. The signal-handling element also includes a signal-handling circuit responsive to the second signal to perform a signal-handling function, e.g., for detecting whether a communication signal is present. The isolating circuit functions to isolate the first circuit and the common signal node from the second conductor and the signal-handling circuit.

Figure 2A:
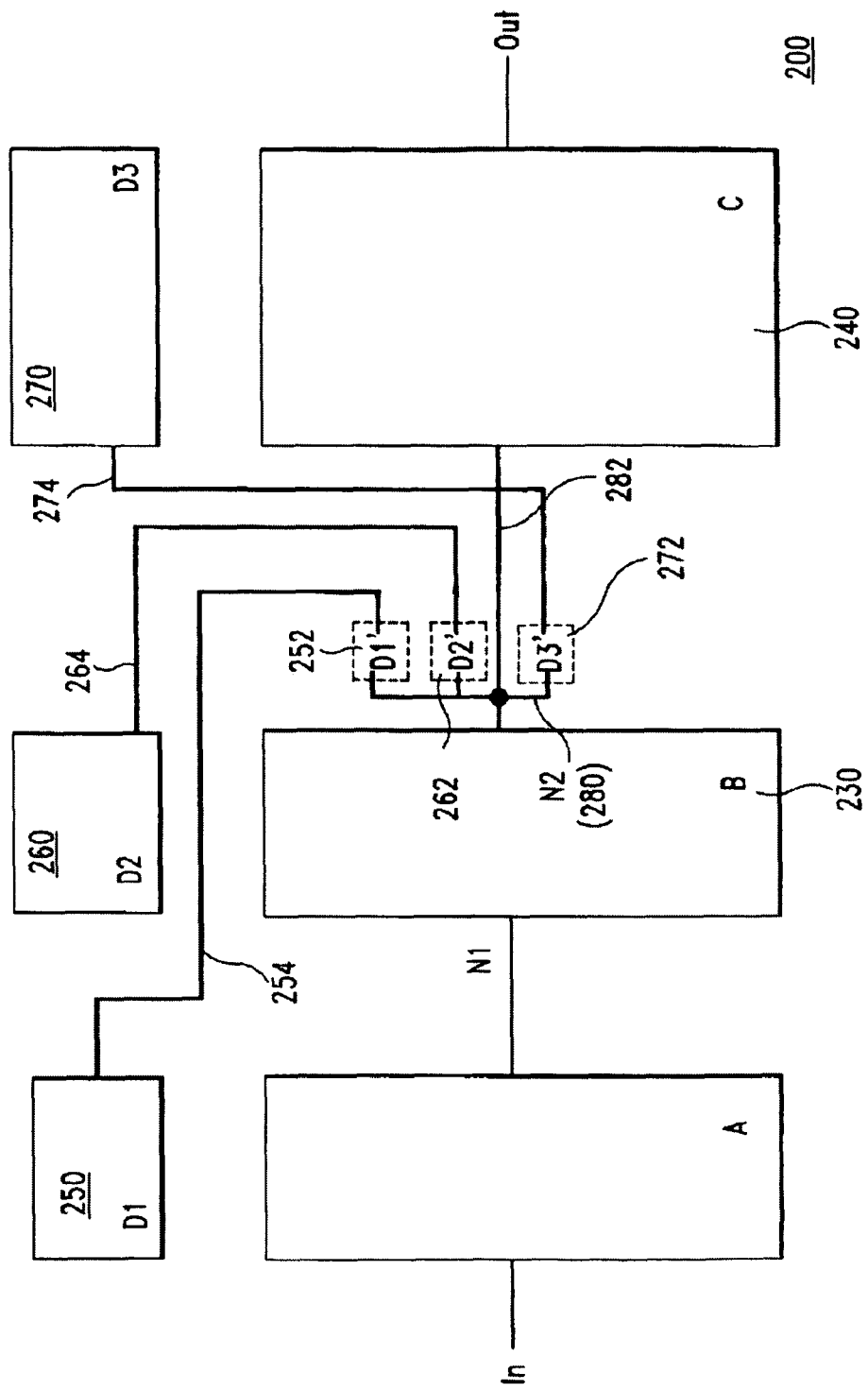
FIG. 2A is a top-down plan view of a system, e.g., a chip, in accordance with one embodiment of the invention.

Thus, as shown in FIG. 2A, in one embodiment of the invention, a communication apparatus 200 includes a plurality of signal handling elements made up of signal-handling circuits and corresponding isolating circuits. In the communication apparatus depicted in FIG. 2A, a first signal-handling element includes a first signal-handling circuit (D1) 250 and a first isolating circuit (D1') 252, a second signal-handling circuit (D2) 260 and a second isolating circuit (D2') 262, and a third signal-handling circuit (D3) 270 and a third isolating circuit (D3') 272. In one embodiment, the isolating circuits are sub-elements of the signal-handling elements, and contain only devices which would be provided in the signal-handling element if the signal-handling element were utilized as one intact block of circuits (e.g., as in circuit block 160; FIG. 1). Alternatively, the isolating circuits include devices in addition to those which would normally be provided when the signal-handling element is provide in one intact block of circuits. As depicted in FIG. 2A, the isolating elements are laid out in a column between the signal processing circuit blocks B (230) and C (240). The column extends in a vertical direction. As used herein, the term "vertical" refers to one direction parallel to the major surface of an integrated circuit, and "horizontal" refers to a second direction parallel to the major surface of the integrated circuit and orthogonal to the vertical direction.

As the signal-handling elements are preferably used to perform test functions, or functions which do not require the full frequency and/or dynamic range of the communication signal to be provided thereto, the condition of the signal arriving at the signal-handling circuits can be degraded. Each isolating circuit is coupled to a first conductor at a common signal node N2 (280) which is operable to conduct a first communication signal between a first signal processing circuit (B) 230 and a second signal processing circuit (C) 240. Illustratively, the second signal processing circuit performs an analog signal processing function on the first communication signal. As an example, the second signal processing circuit performs analog amplification of the first communication signal as one of several processes performed to receive an information signal from the first communication signal.

The isolating circuit of each signal handling element includes one or more input devices or circuits which are directly connected to the common signal node N2. As discussed above, preferably circuitry which embodies the signal-handling element is split up into an isolating circuit and a signal-handling circuit, such that the isolating circuit includes one or more devices which are normally provided in each signal-handling element, if it remained as one intact block of circuits. As one example, an isolating circuit may be as simple as a field effect transistor ("FET") or an inverter formed from a pair of FETs which has an input terminal at the gate of the FET or gates of FETs therein which is tied to the common signal node N2. More complex input circuits are possible. However, it is goal of some embodiments of the invention to reduce lengths of wiring between respective circuit blocks of a communication apparatus. Therefore, in such case, the size of the isolating circuit should not interfere with this goal.

The isolating circuits 252, 262, and 272 output second signals which are isolated from the common signal node N2 (280), the first signal processing circuit (B) 230 and the second signal processing circuit (C) 240. From the isolating circuits, the second signals are conducted on respective second conductors 254, 264, and 274 to the respective signal-handling circuits 250, 260, and 270 where the second signals are then handled in accordance with the circuitry therein. As depicted in FIG. 2A, with this arrangement, the signal-handling circuits are placed at significant distance from the common signal node N2 (280), the length of each of the second conductors 254, 264 and 274 being significantly greater than the length of the first conductor 282 on which the first communication signal is conducted between signal processing circuits B (230) and C (240). Illustratively, the length of the second conductor is greater than one and one-half times as long as the length of the first conductor 282 and may be several times or many times as long as the length of the first conductor. With the isolation afforded by the isolating circuits, the second conductors 254, 264, and 274 do not contribute to parasitic capacitive loading of the signal node N2 (280), and, therefore, do not adversely affect the quality of a first communication signal conducted at node N2. Moreover, since the signal-handling circuits 250, 260 and 270 can perform under degraded signal conditions, the lengths of the conductors 254, 264, and 274 do not interfere with the signal-handling elements performing their required functions.

Figure 2B:
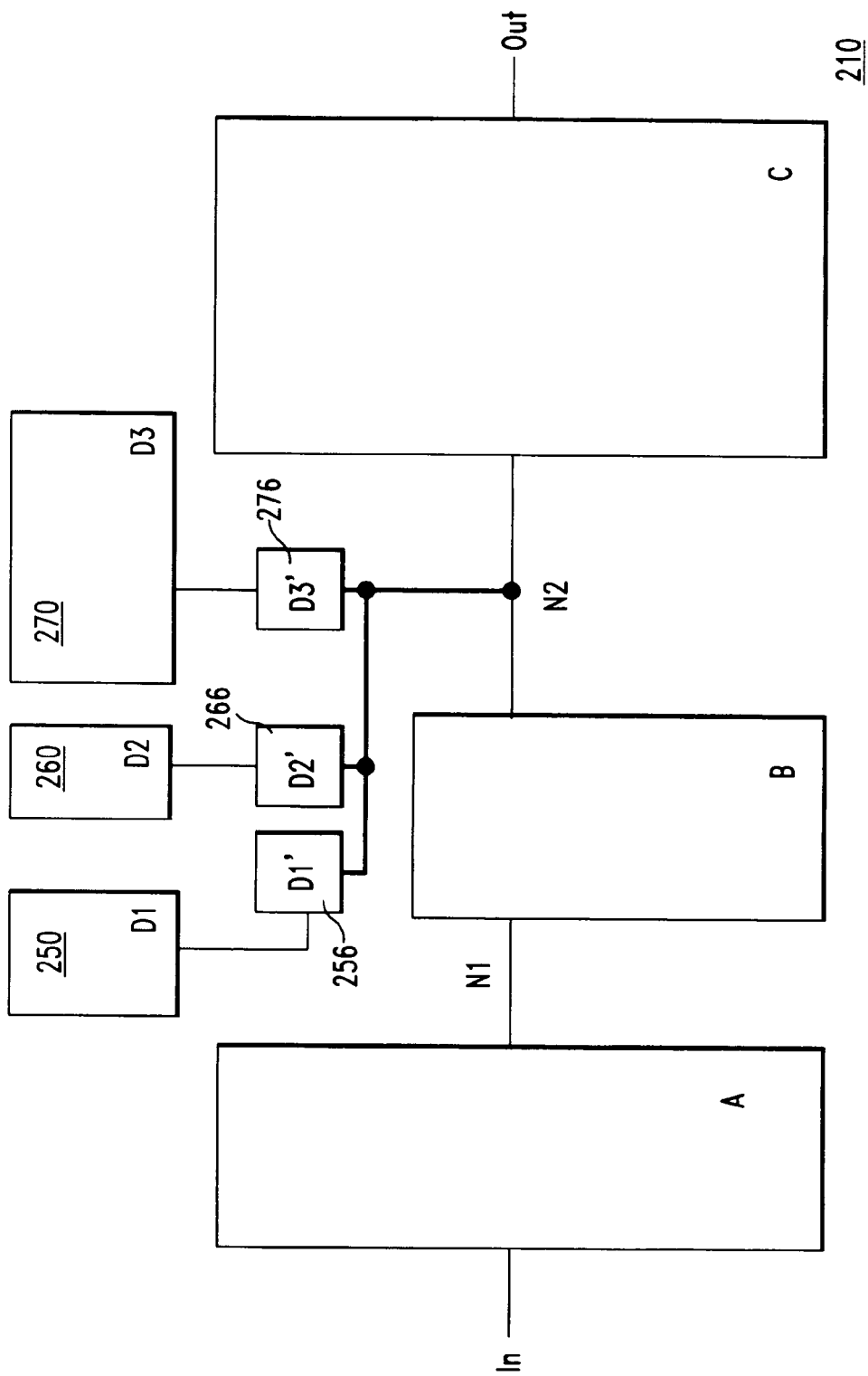
FIG. 2B is a top-down plan view of a system, e.g., a chip, in accordance with a variation of the embodiment of the invention illustrated in FIG. 2A.

FIG. 2B illustrates a communication apparatus 210 according to a variation of the embodiment shown in FIG. 2A. In such variation, all circuitry and their interconnection and function remains the same as that described above relative to FIG. 2A. However, as depicted in FIG. 2B, isolating elements 256, 266, and 276 are now laid out in a horizontally-extending row between signal processing circuit block B (230), the signal processing circuit block C (240), and the signal-handling elements 250, 260, 270. By extension, the particular arrangement in which the isolating elements are laid out and interconnected within the communication apparatus is amenable to much variation. Thus, according to other such arrangements, the isolating elements need not be oriented in vertically or horizontally extending rows, so long as the required function of reducing the amount of loading on the common signal node N2 and the signal processing circuits is achieved.

Figure 3:
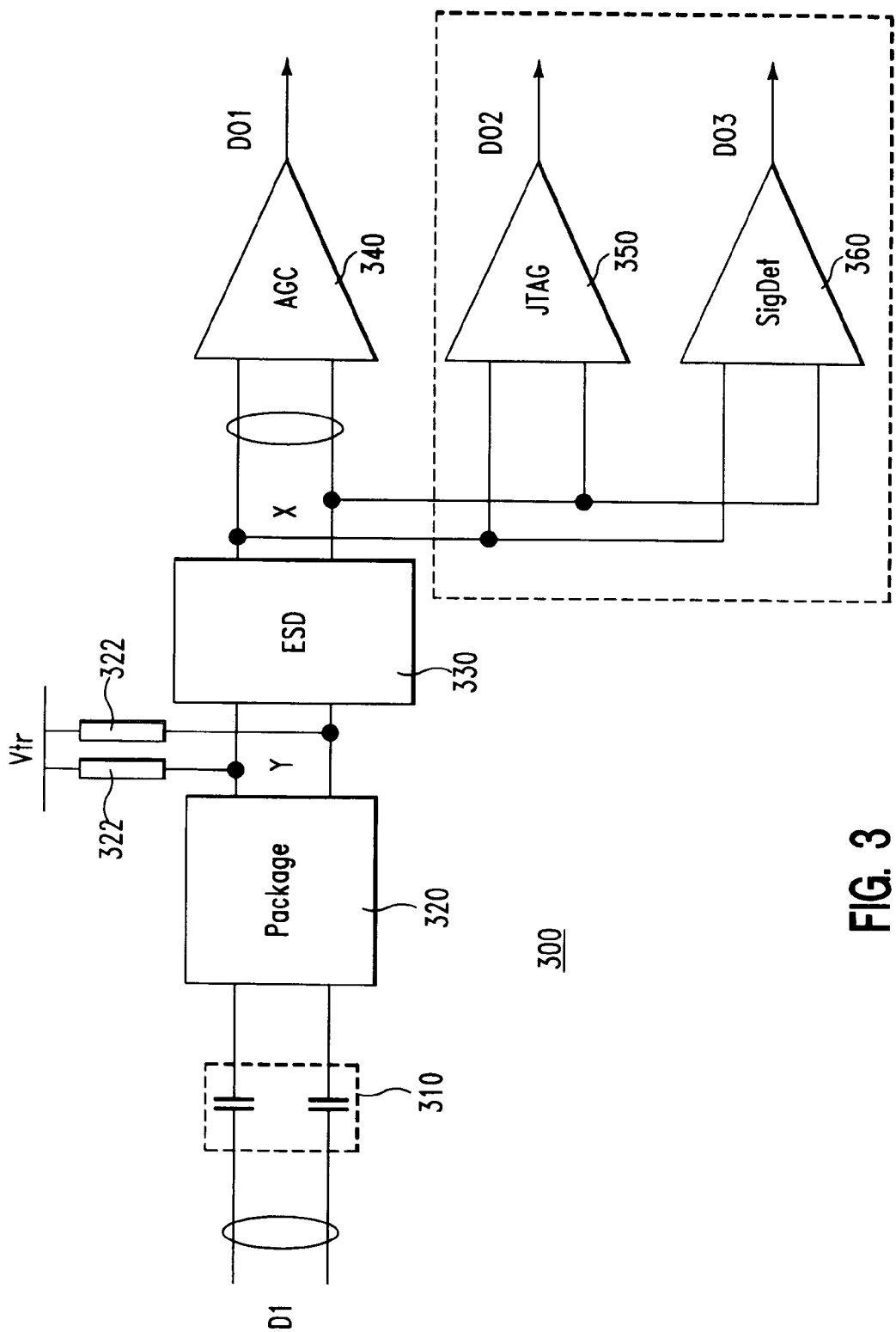
FIG. 3 is a block and schematic diagram schematically illustrating circuit blocks of an HSS receiver.

Referring to FIG. 3, a communication apparatus 300 will now be described in context of an HSS receiver. The HSS receiver is arranged to operate using a pair of differential communication signals denoted as "D1". As shown in FIG. 3, the HSS receiver has a main communication input signal path in which signal D1 is input through a pair of DC blocking capacitors 310 (each having capacitance of 10 nF, for example), package hardware 320, an electro-static discharge ("ESD") protection device 330 and on to an automatic gain-controlled ("AGC") amplifier 340, which outputs an amplified analog signal D01. A termination network connects a pair of signal conductors at node Y through a pair of 50 ohm terminations 322 to a termination supply voltage Vtr.

The input signal as exists at the node X between the ESD 330 and the AGC 340 is provided to two devices that perform functions other than the main communication signal processing. These other devices include a JTAG cable fault detector 350 according to a "JTAG" specification (IEEE 1149.6) of the Institute of Electrical and Electronics Engineers ("IEEE"), and a signal detecting circuit depicted as "SigDet" 360. The wiring required to distribute the signal from node X to these devices can undesirably load node X in a way that degrades the quality of the signal input to AGC 340.

The JTAG fault detector 350 is used for testing and detecting connectivity faults at ends of a cable or transmission line connecting the transmitter on one chip to the receiver on another chip. The JTAG fault detector outputs a signal D02 indicating whether or not connectivity is determined to be good. Testing by the JTAG fault detector 350 can only be done when the receiver is powered on. When cable connectivity is determined to be satisfactory, the JTAG fault detector 350 is turned off.

In addition, a signal detecting circuit represented as "SigDet" 360 functions to quickly determine the presence or absence of a signal at node X, outputting such determination as signal D03. An HSS receiver having such SigDet circuit can quickly determine whether a signal expected at a predetermined transmission rate is present or not. For example, when the cable is unintentionally disconnected (referred to as "loss-of-line"), damaged or temporarily interrupted, the data transmitted during such interval becomes invalid. At such time, the HSS receiver may continue to try to receive the signal, despite that only noise and sometimes cross-talk signals may be present at that time. The SigDet 360 determines when such condition occurs and informs the receiver so that it can decide to scrap a packet of data being received and request that the data packet be resubmitted.

When power is supplied to the receiver, only valid data-bearing signals between chips can be used to generate clock signals used to perform sampling of the data-bearing signal. For that reason, the SigDet 360 must remain powered on and functioning so as to quickly indicate when a problem occurs affecting the validity of the data-bearing signal.

Unfortunately, the SigDet 360 cannot perform the function of the JTAG fault detector 350, or vice versa. The JTAG detector 350 detects cable faults only when the input signal is supplied with a very slow signal rate, and it only detects single-ended faults. By contrast, the SigDet 360 detects signal problems at the highest data transmission rates supported by the receiver. However, SigDet 360 only detects faults which affect the signal conductors of the communication path differentially, i.e., which affect one of a pair of differential signals inputted to the receiver 300 differently than the other differential signal of the pair.

As discussed above, the connection of the JTAG detector 350 and the SigDet 360 add significant loading to the signal node X. Additional loading of the communication path between the input capacitors 310 and node X is caused by the package hardware 320, the terminating impedances 322 and the ESD circuit 330. The following described embodiment only addresses the loading of node X by the JTAG 350 and SigDet.

Figure 4:
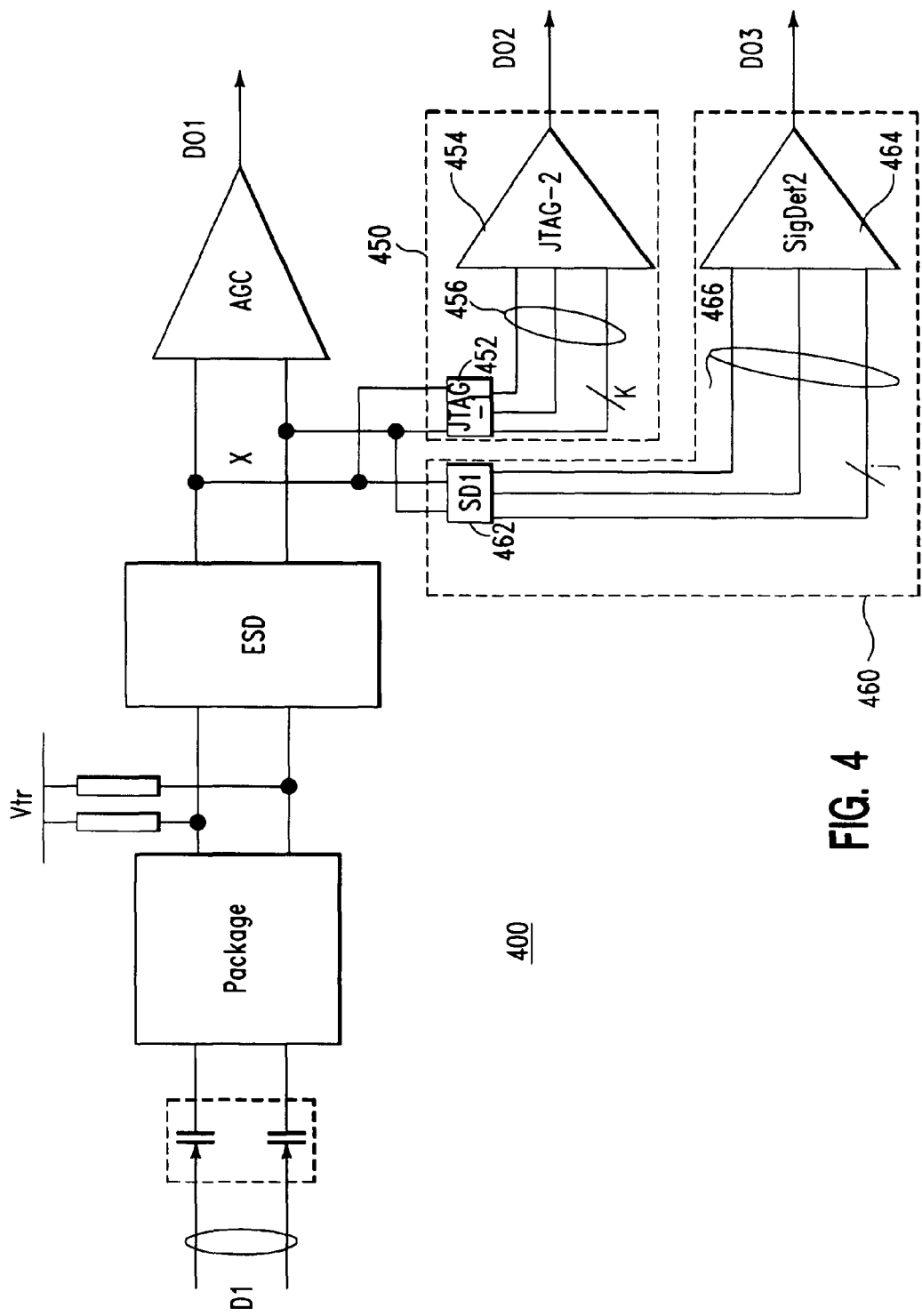
FIG. 4 is a block and schematic diagram illustrating circuit blocks of an HSS receiver according to one embodiment of the invention.

Thus, in FIG. 4, an HSS receiver 400 is provided according to an embodiment of the invention, showing modifications from the HSS receiver 300 (FIG. 3) described above. The HSS receiver 400 is a specific example of a communication system according to an embodiment of the invention described above relative to FIG. 2. In the HSS receiver shown in FIG. 4, the JTAG detector 450 is now separated into two circuit blocks, a JTAG-1 circuit block 452 and a JTAG-2 circuit block 454, the two circuit blocks being connected via conductors 456. The JTAG-1 circuit block 452 contains relatively few devices and functions as an isolating circuit, as described above. Preferably, the JTAG-1 circuit block 452 contains only devices which ordinarily would be included in the intact JTAG detector 350 (FIG. 3), and the JTAG-2 circuit block contains only the remainder of the devices which ordinarily would be included in the intact JTAG detector 350 (FIG. 3) such that there is no duplication or addition to the devices included in the JTAG detector 450. Thus, the JTAG-1 may perform some processing of the signal present at node X beyond the mere function of isolating the signal node X from its output. In view of this, a greater number ("k≧3") of conductive lines or "conductors" are output by the JTAG-1 circuit block to the JTAG-2 circuit block than the two conductors which are present at its input.

Similarly, the SigDet 460 is now separated into two circuit blocks, an SD1 circuit block 462 and a SigDet2 circuit block 464, the two circuit blocks being connected via conductors 466. Like the JTAG-1 circuit block, the SD1 circuit block 462 contains relatively few devices and functions as an isolating circuit, as described above. Preferably, the SD1 circuit block 462 contains only devices which ordinarily would be included in the intact SigDet 360 (FIG. 3), and the SigDet2 circuit block contains only the remainder of the devices which ordinarily would be included in the intact SigDet 360 (FIG. 3) such that there is no duplication or addition to the devices included in the SigDet 460 over those of SigDet 360. Again, similar to the JTAG-1 circuit block, the one or more devices of the SD1 circuit block 462 may perform some processing of the signal present at node X beyond the mere function of isolating the signal node X from its output. Likewise, a greater number ("j≧3") of conductive lines or "conductors" may be output by the SD1 circuit block to the SigDet2 circuit block than the two conductors which are present at its input.

Figure 5:
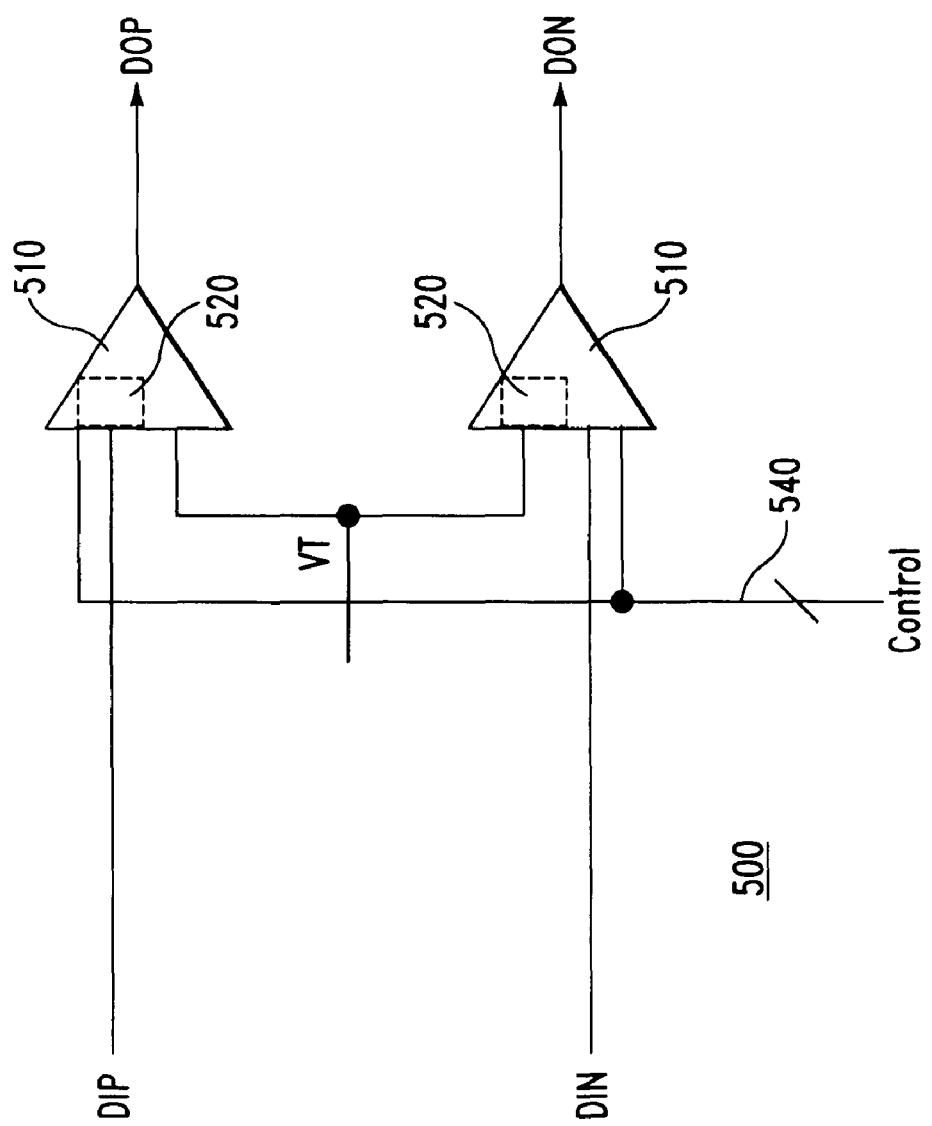
FIG. 5 is a block and schematic diagram illustrating elements of a JTAG circuit block according to one embodiment of the invention.

FIG. 5 is a schematic diagram illustrating the structure of a JTAG detector 500 in greater detail. The JTAG detector 500 is designed to receive a pair of differential signals DIP and DIN each arriving from one transmission line such as a cable. The differential signals are input separately to two identical JTAG detecting circuits 510. Each of the JTAG detecting circuits 510 includes circuitry 520 which is capable of being separated out and utilized to function as an isolating circuit, as described above relative to FIG. 4. Each of the JTAG detecting circuits 510 also receives a voltage threshold level ("VT"), as well as a plurality of control signals (540) to control test function, and to supply a clock signal and test data to the JTAG detecting circuits 510.

Figure 6:
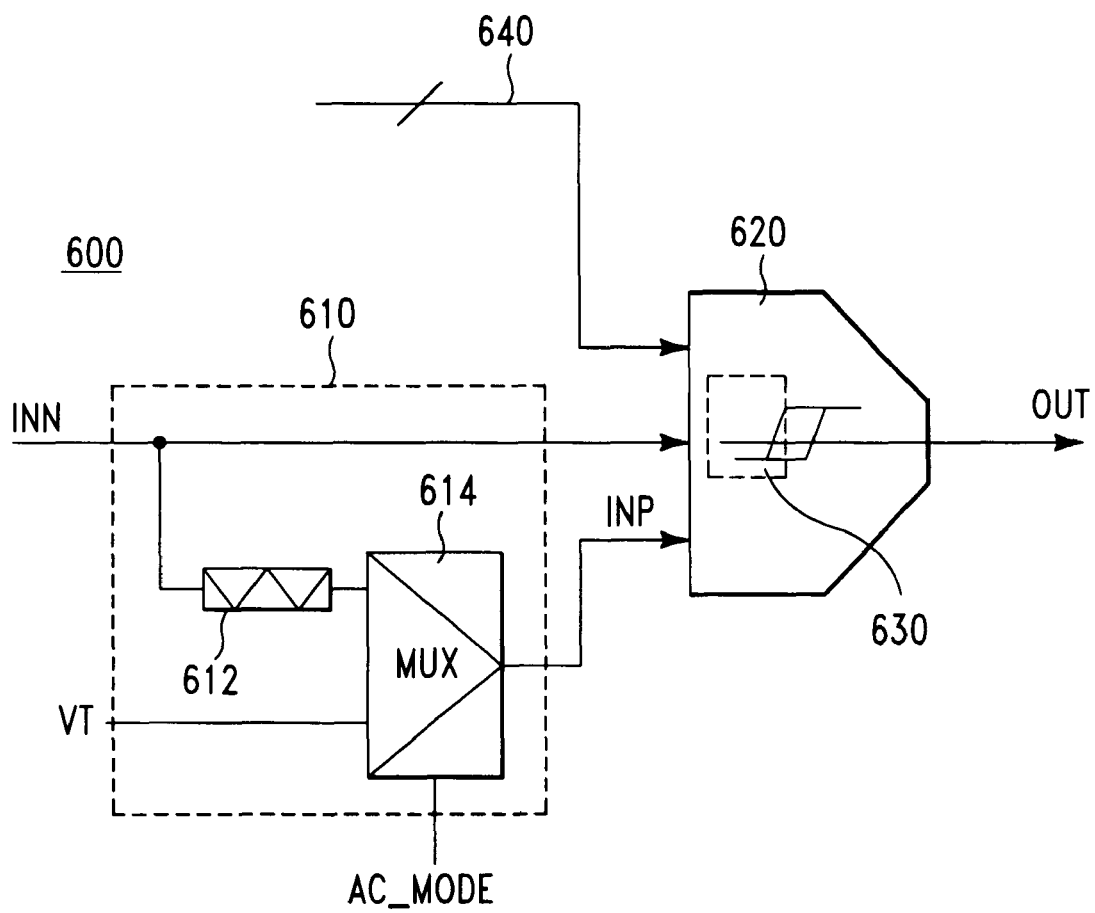
FIG. 6 is a further detailed block and schematic diagram illustrating a portion of a JTAG circuit block according to an embodiment of the invention.

One of the JTAG detecting circuits 510 is illustrated in even greater detail as JTAG detecting circuit 600 in FIG. 6. As in FIG. 5, the JTAG detecting circuit receives a plurality of control signals 640. As also shown in FIG. 6, circuit 600 includes a self-bias reference circuit 610. This circuit 610 includes an RC low-pass filter which includes the combination of a resistor 612 and a p-type field effect transistor ("PFET") transfer device of a multiplexer ("MUX") 614. The self-bias reference circuit 610 receives as inputs one of the differential signal input signals (shown in FIG. 6 as "INN"), an AC mode control signal ("AC_MODE") and a voltage threshold level ("VT"). The AC mode control signal is used to select an alternating current ("AC") coupled mode in which the HSS receiver is connected to a transmitter via AC coupling, and to select direct current ("DC") mode coupling when the HSS receiver is connected to a transmitter via DC coupling. Circuit 610 passes the threshold voltage level (VT)

when the HSS receiver is connected via DC coupling. Circuit 610 creates a self-bias voltage reference for use when the HSS receiver is connected via AC coupling.

Figure 7:
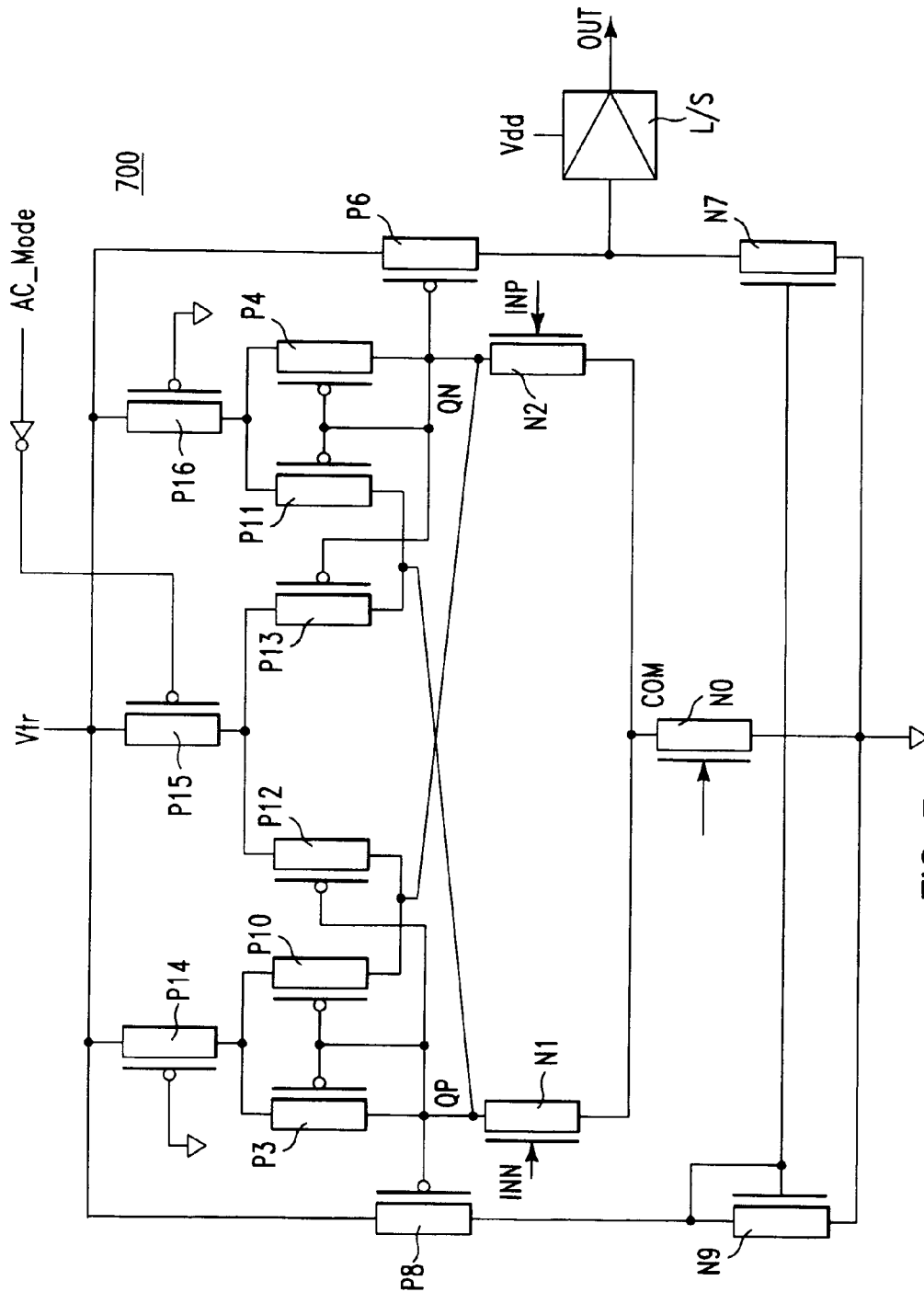
FIG. 7 is a detailed schematic diagram illustrating a hysteresis comparator portion of a JTAG circuit block according to an embodiment of the invention.

Outputs INN and INP of the self-bias reference circuit 610 are provided to an input circuit element 630 of a hysteresis comparator 620. The hysteresis comparator 620 outputs a signal ("OUT") indicating the status of testing the cable. A detailed device-level diagram of the hysteresis comparator is shown at 700 in FIG. 7. The comparator 700 illustrated in FIG. 7 functions to provide a greater amount of hysteresis when the HSS core is connected and operated in an AC coupling mode (when signal AC_Mode=high) than when it is operated in a direct current ("DC") coupling mode. As such, the PFET devices P12 and P13 of the comparator 700 are shunted during the DC coupled mode (when signal AC_Mode=low) such that the transconductance ratio of devices P10 to P3, identical in size, and the transconductance ratio of devices P11 to P4, also identical in size, becomes close to unity. The devices P14 and P10, which are constantly turned on, are needed to shunt the above-named devices. During AC coupled mode operation, the devices P12 and P13 are not shunted; thus, at such time, the comparator 700 is operated with a greater amount of hysteresis.

Within the comparator 700, the input circuit element 630 includes a pair of n-type field effect transistors ("NFETs") N1 and N2 as input devices which receive the input signals INN and INP. These devices N1 and N2 produce outputs to the internal nodes of the hysteresis comparator 700, the outputs being electrically isolated from the inputs INN and INP. Because of this, the input circuit element 630 including devices N1 and N2 is included as part of the isolating JTAG-1 circuit block (452; FIG. 4) described above. In addition, based on the foregoing, the self-bias reference circuit 610, including the RC filter and the multiplexer are relatively small in area and are tied directly to one of the differential input signals (INN). For this reason, circuit 610 is also appropriate for inclusion in the JTAG-1 circuit block (452; FIG. 4). Thus, preferably, these circuit elements 610 and 630 together form the JTAG-1 circuit block 452 described above with reference to FIG. 4.

Figure 8:
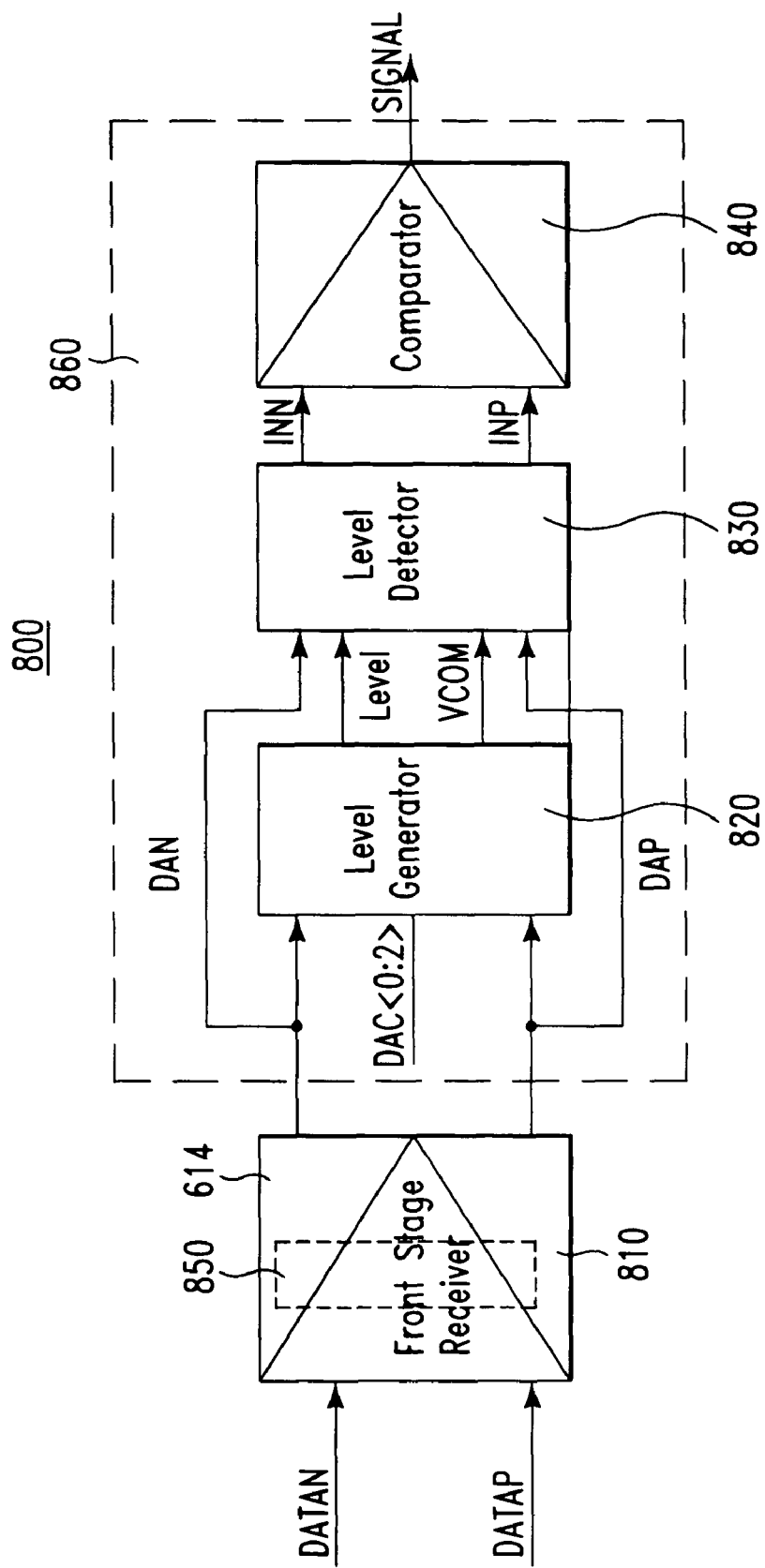
FIG. 8 is a block and schematic diagram illustrating elements of a signal detector element according to one embodiment of the invention.

Turning now to the SigDet signal detector 460 (FIG. 4), it is relatively easy to identify the SigDet1 circuit block 462. A detailed functional block diagram of a signal detector or ("SigDet") 800 is illustrated in FIG. 8. The SigDet includes a front stage receiver circuit 810 to which the differential signals DATAN and DATP are input from node X (FIG. 4). The SigDet also includes a level generator circuit 820, a level detector circuit 830 and a comparator 840. Preferably, the SigDet is divided into a SigDet1 block 850 which includes the front stage receiver 810 portion or just a portion of the front stage receiver, being the circuit block of the SigDet which receives the input signals DATAN and DATAP. This first block directly connects to node X may include circuitry usable to extend the bandwidth of the SigDet. The circuit block 810 may also be used to readjust the common mode of the incoming signal from node X.

The SigDet2 portion 860 of the SigDet block 800 preferably includes the remainder of the circuitry, i.e., the level generator 820, level detector 830 and comparator 840. This portion occupies greater area than the first (SD1) portion, and thus can be placed in any adjacent available space. It is to be noted that no extra additional conductors (wiring) is needed to connect the SD1 and SigDet2, just the existing wires DAN and DAP from SD1 (850).

Figure 10:
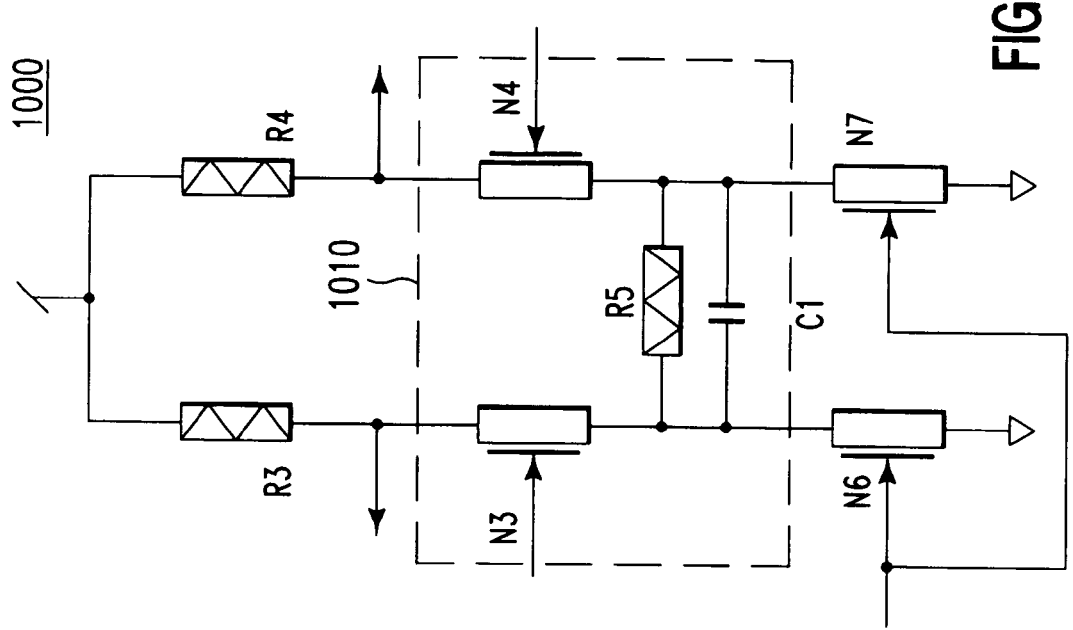
FIG. 10 is a detailed schematic diagram illustrating a front-end receiver portion of a signal detector element in accordance with a variation of the embodiment of the invention illustrated in FIG. 9.
Figure 9:
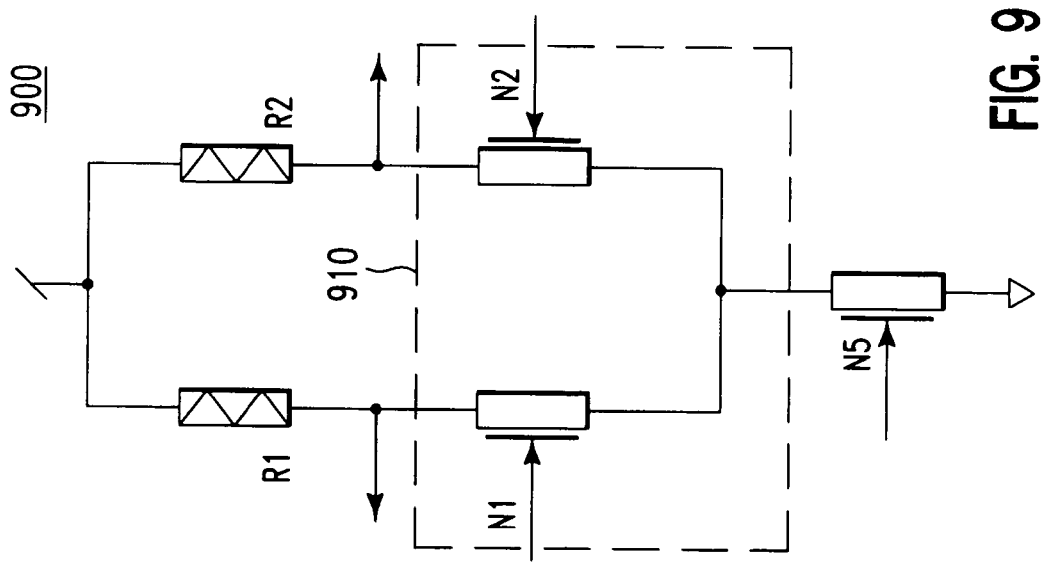
FIG. 9 is a detailed schematic diagram illustrating a front-end receiver portion of a signal detector element in accordance with one embodiment of the invention.

FIGS. 9 and 10 illustrate alternative front stage receivers which are suitable for use as the front stage receiver element (810; FIG. 8) of the SigDet. FIG. 9 illustrates a linear amplifying front stage receiver 900, while FIG. 10 illustrates a front stage receiver 1000 having a peaking function. In case of the front stage receiver 900, the device pair 910 can be removed from the front stage receiver and used as the SD1 circuit block (850; FIG. 8), while the remaining portion of the front stage receiver 900 forms a part of the SigDet2 circuitry (860; FIG. 8). Alternatively, in the case of front stage receiver 1000, the device pair 1010 and associated shunt elements R5 and C1 are removed from the front stage receiver 1000 and used as the SD1 circuit block 850, while the remaining portion of the front stage receiver 900 forms a part of the SigDet2 circuitry 860.

Figure 11:
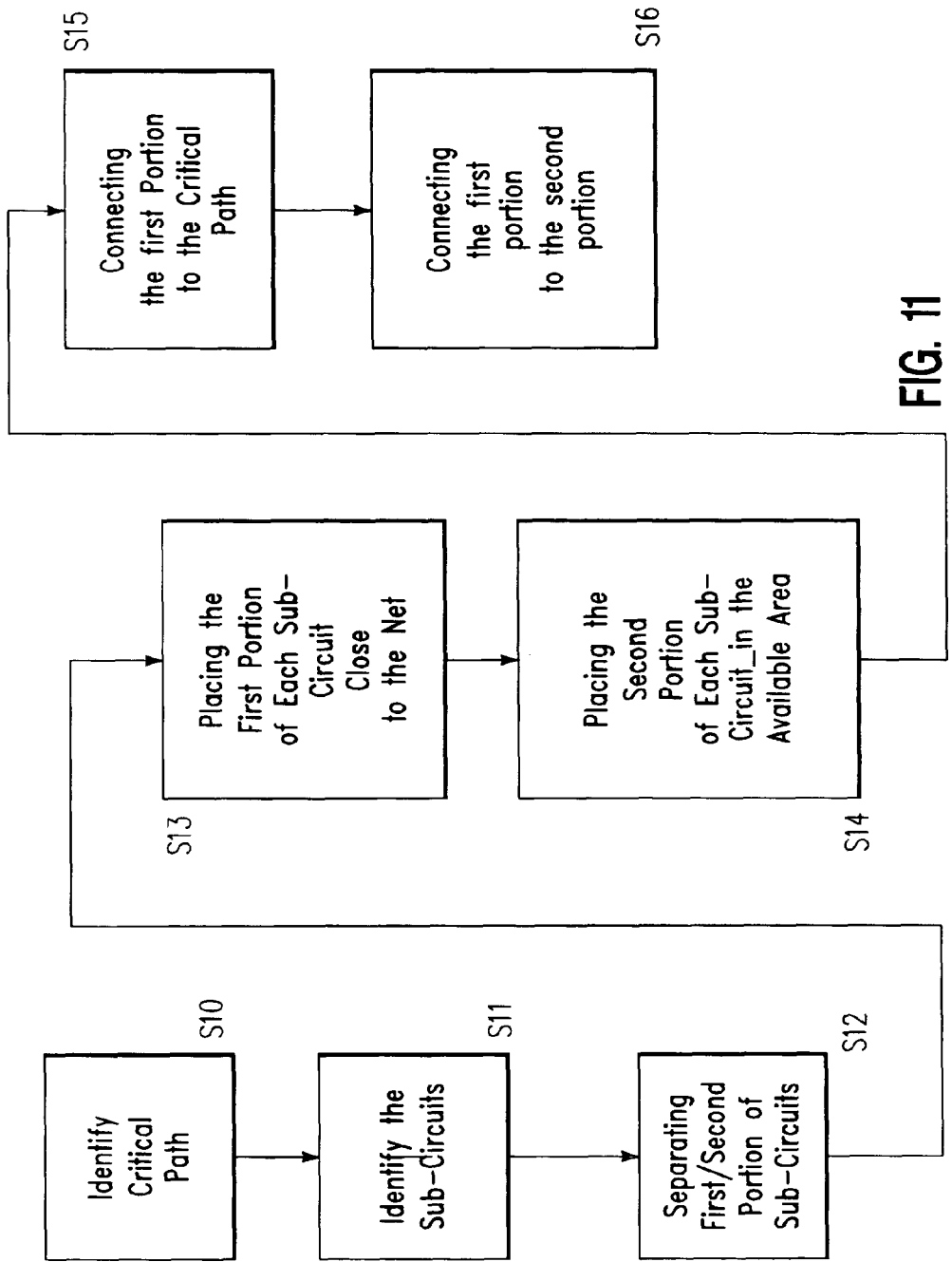
FIG. 11 is a diagram illustrating a process flow in a method according to an embodiment of the invention.

Finally, in a method according to an embodiment of the invention circuitry is laid out within a system, for example, an integrated circuit, so as to reduce loading due to signal-handling elements which are connected to a main signal-bearing node. Thus, in accordance with the flow diagram illustrated in FIG. 11, in an initial step (S10) a critical path is identified for the transmission of a signal. In step S11, particular circuit blocks attached to the critical path, i.e., "sub-circuits," are identified. In step S12, some or all of the sub-circuits are separated into at least first and second portions, i.e., into isolating circuits and signal-handling circuits as described above.

In step S13, one portion, i.e., a "first" portion of each sub-circuit, i.e., the isolating circuit, is placed at a location within the integrated circuit area which allows the length of the conductor thereto to be relatively short. Consequently, this permits the first portion of the sub-circuit to be placed at a location which is "close to the net," i.e., close to a source of the signal. The second portion of each sub-circuit (S14) is placed in available area of the integrated circuit without being required to be placed close to a source of the signal. Finally, to complete the method, in step S15, the first portion of the sub-circuit is connected to the critical path, and in step S16 the first portion of the sub-circuit is connected to the second portion of the sub-circuit, i.e., via one or more signal conductors.

Figure 12:
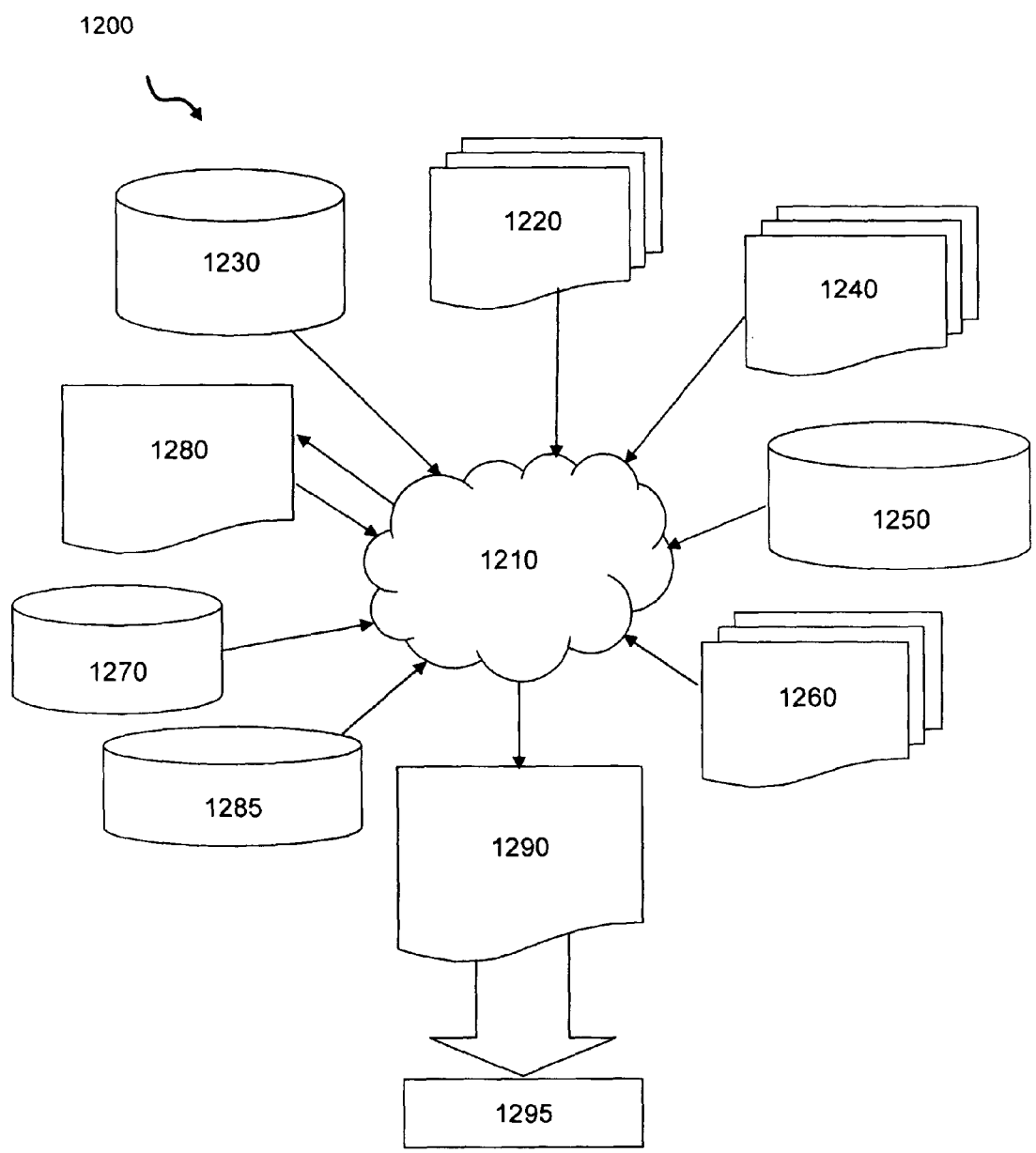
FIG. 12 is a flow diagram illustrating a design process used in semiconductor design, manufacturing, and/or test in accordance with an embodiment of the invention.

FIG. 12 shows a block diagram of an example design flow 1200. Design flow 1200 may vary depending on the type of IC being designed. For example, a design flow 1200 for building an application specific IC (ASIC) may differ from a design flow 1200 for designing a standard component. Design structure 1220 is preferably an input to a design process 1210 and may come from an IP provider, a core developer, or other design company or may be generated by the operator of the design flow, or from other sources. Design structure 1220 can include a communication apparatus (FIG. 1) in the form of schematics or HDL, a hardware-description language (e.g., Verilog, VHDL, C, etc.). Design structure 1220 may be contained on one or more machine readable medium. For example, design structure 1220 may be a text file or a graphical representation of the communication apparatus 200 or signal-handling apparatus such as that illustrated herein with respect to FIG. 2A et seq. Design process 1210 preferably synthesizes (or translates) the communication apparatus into a netlist 1280, where netlist 1280 is, for example, a list of wires, transistors, logic gates, control circuits, I/O, models, etc. that describes the connections to other elements and circuits in an integrated circuit design and recorded on at least one of machine readable medium. This may be an iterative process in which netlist 1280 is resynthesized one or more times depending on design specifications and parameters for the circuit.

Design process 1210 may include using a variety of inputs; for example, inputs from library elements 1230 which may house a set of commonly used elements, circuits, and devices, including models, layouts, and symbolic representations, for a given manufacturing technology (e.g., different technology nodes, 32 nm, 45 nm, 90 nm, etc.), design specifications 1240, characterization data 1250, verification data 1260, design rules 1270, and test data files 1285 (which may include test patterns and other testing information). Design process 1210 may further include, for example, standard circuit design processes such as timing analysis, verification, design rule checking, place and route operations, etc. One of ordinary skill in the art of integrated circuit design can appreciate the extent of possible electronic design automation tools and applications used in design process 1210 without deviating from the scope and spirit of the invention. The design structure of the invention is not limited to any specific design flow.

Design process 1210 preferably translates an embodiment of the invention as described herein with respect to FIG. 2A et seq., along with any additional integrated circuit design or data (if applicable), into a second design structure 1290. Design structure 1290 resides on a storage medium in a data format used for the exchange of layout data of integrated circuits (e.g. information stored in a GDSII (GDS2), GL1, OASIS, or any other suitable format for storing such design structures). Design structure 1290 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as depicted herein with respect to FIG. 2A et seq. Design structure 1290 may then proceed to a stage 1295 where, for example, design structure 1290: proceeds to tape-out, is released to manufacturing, is released to a mask house, is sent to another design house, is sent back to the customer, etc.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method in a computer-aided design system for generating a functional design model of an apparatus for handling a signal, comprising:
   using a computer in:
   generating a functional representation of at least one common signal node having a first conductor operable to conduct a first signal;
   generating a functional representation of a first circuit coupled to said common signal node, operable to receive said first signal;
   generating a functional representation of a signal-handling element coupled to said first conductor, said signal-handling element having an isolating circuit coupled to said first conductor;
   generating a functional representation of a second conductor operable to conduct an output of said isolating circuit; and
   generating a functional representation of a signal-handling circuit coupled to said second conductor, said signal-handling circuit operable to perform a signal-handling function in response to said output of said isolating circuit,
   wherein said isolating circuit is operable to isolate said common signal node and said first circuit from said second conductor and said signal-handling circuit, wherein said step of generating a functional representation of a signal-handling element further includes generating a functional representation of a hysteresis comparator included in said signal-handling element, wherein said isolating circuit includes an input transistor of said hysteresis comparator, said input transistor being coupled to receive input from said common signal node and to provide output onto said second conductor, said hysteresis comparator further including a portion included in said signal-handling circuit, said portion including comparator circuitry responsive to said output on said signal conductor, and wherein said functional representation of said common signal node includes a pair of first conductors, said second conductor includes a pair of said second conductors, said functional representation of said first communication signal includes a differential communication signal conducted by said pair of first conductors, and said functional representation of said signal-handling element includes a signal detector, said functional representation of said isolating circuit includes a front stage receiver element of said signal detector operable to regenerate said differential communication signal as a pair of regenerated signals on said pair of second conductors, and said functional representation of said signal-handling circuit of said signal detector includes circuitry operable to produce time-averaged signals from said regenerated signals, said signal-handling circuit being operable in response to said time-averaged signals to detect presence or absence of said first communication signal.

2. The method as claimed in claim 1, wherein said step of generating a functional representation of a signal-handling element further includes generating a functional representation of a hysteresis comparator included in said signal-handling element, wherein said isolating circuit includes an input transistor of said hysteresis comparator, said input transistor being coupled to receive input from said common signal node and to provide output onto said second conductor, said hysteresis comparator further including a portion included in said signal-handling circuit, said portion including comparator circuitry responsive to said output on said signal conductor.

3. The method as claimed in claim 2, wherein said functional representation of said isolating circuit includes a first self-bias reference generator including a low-pass filter coupled to one of said pair of first conductors, said functional representation of said signal-handling element further includes a multiplexer operable to provide an output selected from a fixed potential and an output of said self-bias reference generator, and said output being selected in accordance with at least one of a direct current ("DC") and an alternating current ("AC") transmission mode of said first communication signal.

4. The method as claimed in claim 1, wherein said functional design model comprises a netlist which describes the signal-handling apparatus.

* * * * *